(12) United States Patent
Zhou

(10) Patent No.: US 11,063,052 B2
(45) Date of Patent: Jul. 13, 2021

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation Shanghai, China, Shanghai (CN); Semiconductor Manufacturing International (Beijing) Corporation Beijing, China, Beijing (CN)

( * ) Notice: Subject to any disclaimer, the term of this patent is extended or adjusted under 35 U.S.C. 154(b) by 0 days.

(21) Appl. No.: 16/536,766

(22) Filed: Aug. 9, 2019

(65) Prior Publication Data
US 2020/0098765 A1 Mar. 26, 2020

(30) Foreign Application Priority Data
Sep. 26, 2018 (CN) .......................... 201811124624.9

(51) Int. Cl.
*H01L 27/11* (2006.01)
*H01L 21/8238* (2006.01)
(Continued)

(52) U.S. Cl.
CPC .... *H01L 27/1104* (2013.01); *H01L 21/26513* (2013.01); *H01L 21/30604* (2013.01);
(Continued)

(58) Field of Classification Search
CPC .......... H01L 27/1104; H01L 21/26513; H01L 21/30604; H01L 21/76224; H01L 21/823814; H01L 21/823821; H01L 21/823864; H01L 21/823878; H01L 27/0924; H01L 29/36; H01L 29/66636
(Continued)

(56) References Cited

U.S. PATENT DOCUMENTS

2015/0294879 A1* 10/2015 Zhu ................... H01L 29/66545
438/283
2016/0148846 A1* 5/2016 Ok .................... H01L 21/76831
257/369
(Continued)

*Primary Examiner* — Dzung Tran
(74) *Attorney, Agent, or Firm* — Anova Law Group, PLLC

(57) ABSTRACT

A semiconductor device and a fabrication method are provided. The method includes forming a first fin structure and a second fin structure on a substrate. The first fin structure includes a first sidewall surface, facing to the second fin structure, and a second sidewall surface opposite to the first sidewall surface. The method also includes forming an isolation layer to cover a portion of sidewall surfaces of the first fin structure and the second fin structure. The top surface of the isolation layer is lower than the top surfaces of the first fin structure and the second fin structure. The method further includes forming a first sidewall on the first sidewall surface; forming a first doped layer in the first fin structure; and forming a second doped layer in the second fin structure. The first sidewall covers a portion of a sidewall surface of the first doped layer.

20 Claims, 6 Drawing Sheets

(51) Int. Cl.
*H01L 21/265* (2006.01)
*H01L 29/36* (2006.01)
*H01L 21/306* (2006.01)
*H01L 27/092* (2006.01)
*H01L 29/66* (2006.01)
*H01L 21/762* (2006.01)
*H01L 21/02* (2006.01)

(52) U.S. Cl.
CPC .............. *H01L 21/76224* (2013.01); *H01L 21/823814* (2013.01); *H01L 21/823821* (2013.01); *H01L 21/823864* (2013.01); *H01L 21/823878* (2013.01); *H01L 27/0924* (2013.01); *H01L 29/36* (2013.01); *H01L 29/66636* (2013.01); *H01L 21/0217* (2013.01); *H01L 21/0228* (2013.01); *H01L 21/02164* (2013.01); *H01L 21/02211* (2013.01); *H01L 29/66545* (2013.01)

(58) Field of Classification Search
USPC ........................................................ 257/401
See application file for complete search history.

(56) References Cited

U.S. PATENT DOCUMENTS

| | | | |
|---|---|---|---|
| 2016/0268260 A1* | 9/2016 | Lim | H01L 29/167 |
| 2018/0005841 A1* | 1/2018 | Farmer | H01L 21/3065 |
| 2019/0067419 A1* | 2/2019 | Zhou | H01L 21/823821 |
| 2019/0164765 A1* | 5/2019 | Yeoh | H01L 21/823842 |

* cited by examiner

SEMICONDUCTOR DEVICES AND FABRICATION METHODS THEREOF

CROSS-REFERENCES TO RELATED APPLICATIONS

This application claims the priority of Chinese Patent Application No. CN201811124624.9, filed on Sep. 26, 2018, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

With the rapid development of semiconductor manufacturing technology, semiconductor devices are moving toward having higher component densities and higher integration. As the most basic semiconductor device, field-effect transistor (FET) has been widely used in the semiconductor industry. The control of the channel current in conventional planar FETs becomes weaker, which results in the short channel effect (SCE), leads to a leakage current, and ultimately affects the electrical performance of the semiconductor device.

In current technology, a fin field-effect transistor (Fin FET) has been proposed to overcome the SCE and suppress the leakage current in semiconductor devices. The Fin FET is a common multi-gate device and includes a fin structure and an isolation layer disposed on the surface of a semiconductor substrate. The isolation layer covers a portion of the sidewall surface of the fin structure, and the surface of the isolation layer is lower than the top of the fin structure. The Fin FET also includes a gate structure formed on the surface of the isolation layer and covering the top and sidewall surfaces of the fin structure; and a source region and a drain region formed in the fin structure on the two sides of the gate structure, respectively.

However, the performance of semiconductor devices fabricated based on the existing technology may still need to be improved, the disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes forming a first fin structure and a second fin structure adjacent to the first fin structure on a substrate. The first fin structure includes a first sidewall surface and a second sidewall surface opposite to the first sidewall surface. The first sidewall surface faces to the second fin structure. The method also includes forming an isolation layer on the substrate. The isolation layer covers a portion of sidewall surfaces of the first fin structure and the second fin structure, and the top surface of the isolation layer is lower than the top surfaces of the first fin structure and the second fin structure. The method further includes forming a first sidewall on the first sidewall surface of the first fin structure; forming a first doped layer in the first fin structure; and forming a second doped layer in the second fin structure. The first sidewall covers a portion of a sidewall surface of the first doped layer.

Another aspect of the present disclosure provides a semiconductor device. The semiconductor device includes a substrate; and a first fin structure and a second fin structure formed on the substrate. The second fin structure is adjacent to the first fin structure. The first fin structure includes a first sidewall surface and a second sidewall surface opposite to the first sidewall surface. The first sidewall surface faces to the second fin structure. The semiconductor device also includes an isolation layer formed on the substrate. The isolation layer covers a portion of sidewall surfaces of the first fin structure and the second fin structure, and the top surface of the isolation layer is lower than the top surfaces of the first fin structure and the second fin structure. The semiconductor device further includes a first sidewall formed on the first sidewall surface of the first fin structure; a first doped layer formed in the first fin structure; and a second doped layer formed in the second fin structure. The first sidewall covers a portion of a sidewall surface of the first doped layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
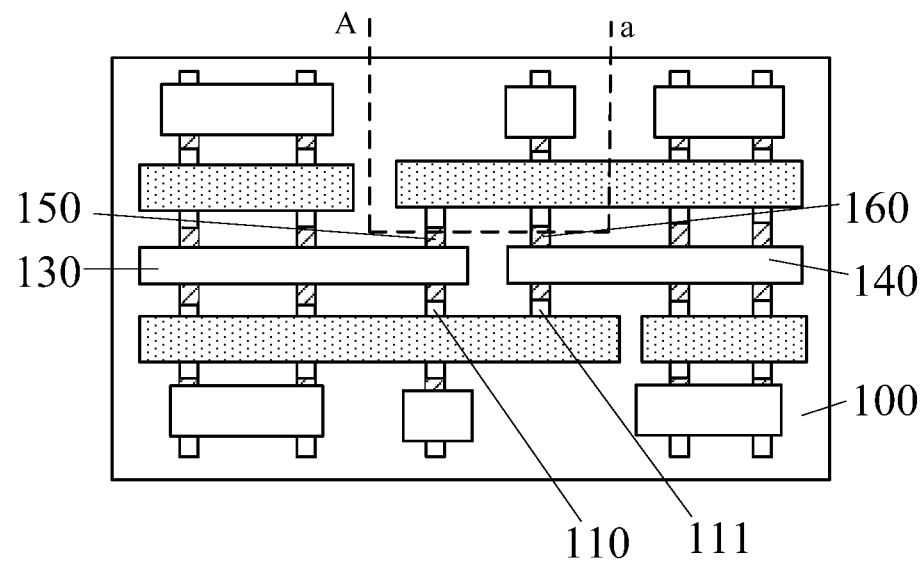
FIGS. 1-2 illustrate schematic views of a semiconductor structure at a certain stage of a method for fabricating a semiconductor device.
Figure 2:
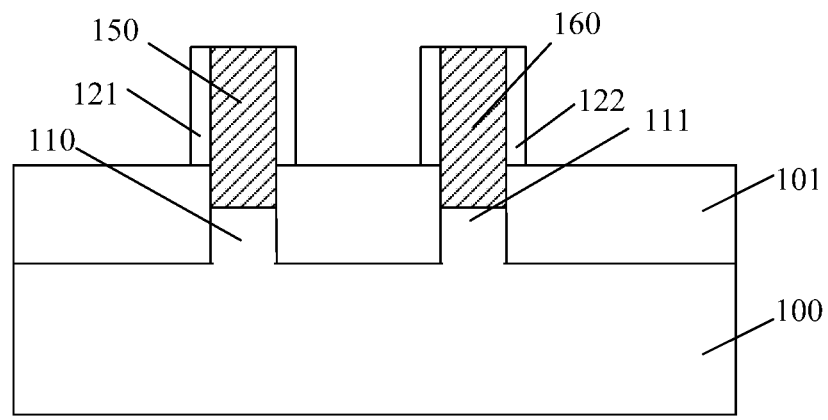

FIGS. 1-2 illustrate schematic views of a semiconductor structure at a certain stage of a method for fabricating a static random-access memory (SRAM). Specifically, FIG. 2 illustrates a schematic cross-sectional view of the semiconductor structure shown in FIG. 1 along an A-a line. Referring to FIGS. 1-2, the method for fabricating the SRAM includes providing a substrate 100. A first fin structure 110 and a second fin structure 111 are disposed on the substrate 100. The first fin structure 110 and the second fin structure 111 are adjacent to each other. The SRAM also includes an isolation layer 101 covering a portion of the sidewall surfaces of the first fin structure 110 as well as a portion of the sidewall surfaces of the second fin structure 111, a first gate structure 130 formed on the isolation layer 101 and across the first fin structure 110, a first source/drain doped layer 150 formed in the first fin structure 110 on the two sides of the first gate structure 110, a second gate structure 140 formed on the isolation layer 101 and across the second fin structure 111, and a second source/drain doped layer 160 formed in the second fin structure 111 on the two sides of the second gate structure 140. The second source/drain doped layer 160 and the first source/drain doped layer 150 are adjacent to each other.

However, the performance of the SRAM formed according to the method described above may still be undesired. When the first gate structure is used to form a pull-up (PU) transistor, the transistor is a P-type transistor. Due to the difference in the growth speed along different crystal directions, the growth of the first source/drain doped layer 150 in the <111> crystal direction is slowest. Therefore, the epitaxial crystal plane is expected to stop on the (111) crystal plane, but continue to grow on other crystal planes, thereby forming sharp tips. Similarly, when the second gate structure is used to form a PU transistor, the second source/drain doped layer 160 may also form sharp tips. As semiconductor devices are developed a long a direction toward having higher density, the distance between transistors that form the semiconductor devices is also getting smaller and smaller. For example, the space between the second source/drain doped layer 160 and the first source/drain doped layer 150 becomes smaller. In order to prevent the first source/drain doped layer 150 from bridging with the second source/drain doped layer 160, a first sidewall spacer 121 and a second sidewall spacer 122 are formed on the sidewall surfaces of the first source/drain doped layer 150 and the second source/drain doped layer 160, respectively. The first sidewall spacer 121 and the second sidewall spacer 122 respectively restrict the shapes of the first source/drain doped layer 150 and the second source/drain doped layer 160, such that sharp tips are less likely formed on the surfaces of the first source/drain doped layer 150 and the second source/drain doped layer 160, and thus bridging is less likely to occur.

However, because of the restriction of the first sidewall spacer 121 and the second sidewall spacer 122, the first source/drain doped layer 150 and the second source/drain doped layer 160 are small in volume, and accordingly, the surface areas are respectively small. Therefore, the contact resistance between a plug formed in a subsequent process and the first source/drain doped layer 150 or the second source/drain doped layer 160 may be large, which may further affect the performance of the formed SRAM.

Figure 10:
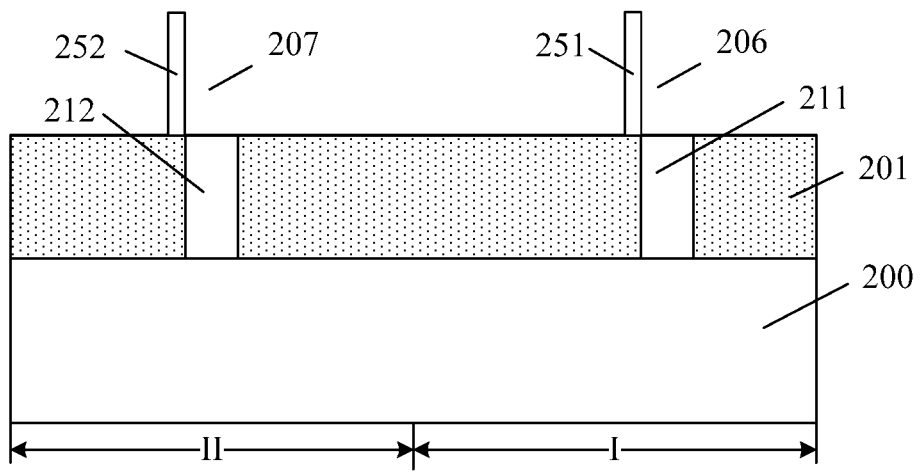
Figure 11:
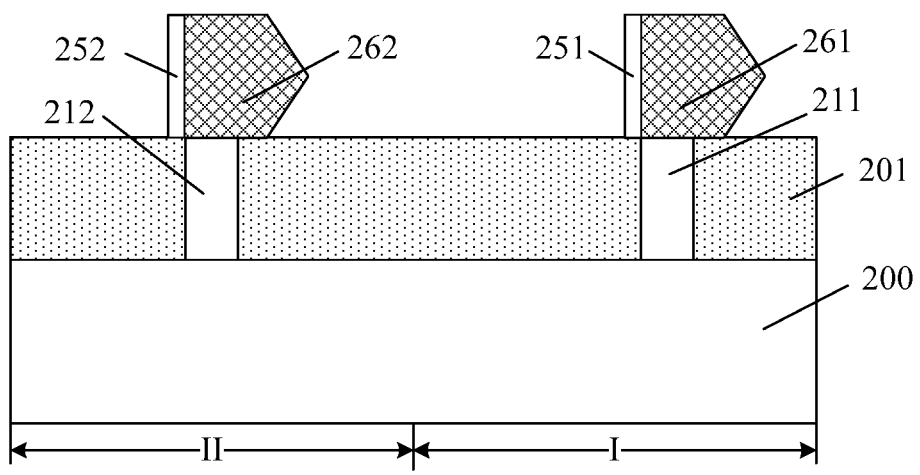
Figure 12:
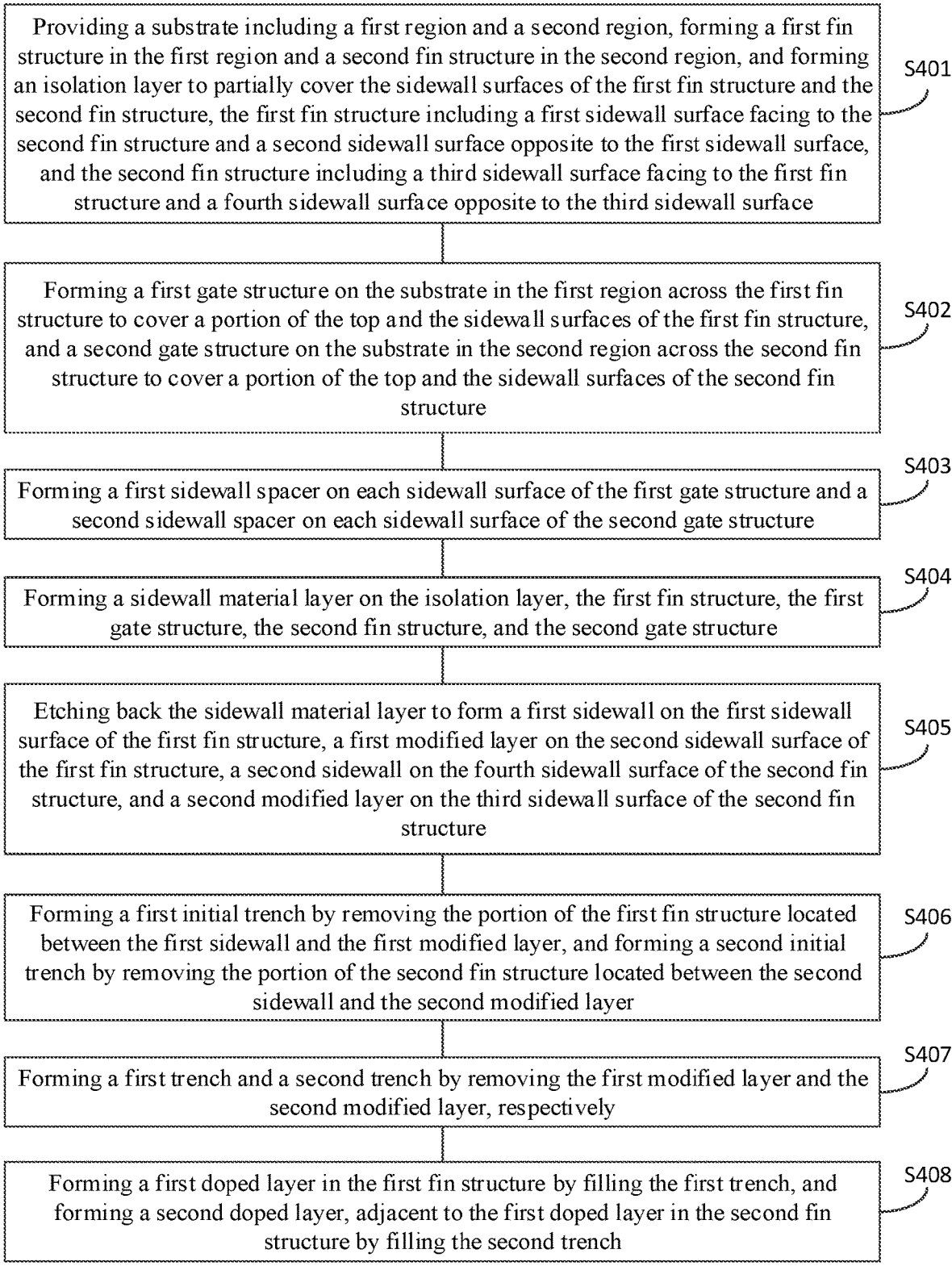
FIG. 12 illustrates a flowchart of an exemplary method for fabricating a semiconductor device consistent with various embodiments of the present disclosure.

The present disclosure provides a method for fabricating a semiconductor device. FIG. 12 illustrates a flowchart of an exemplary method for fabricating a semiconductor device consistent with various embodiments of the present disclosure. FIGS. 3-11 illustrate schematic views of semiconductor structures at certain stages of the exemplary method.

Figure 3:
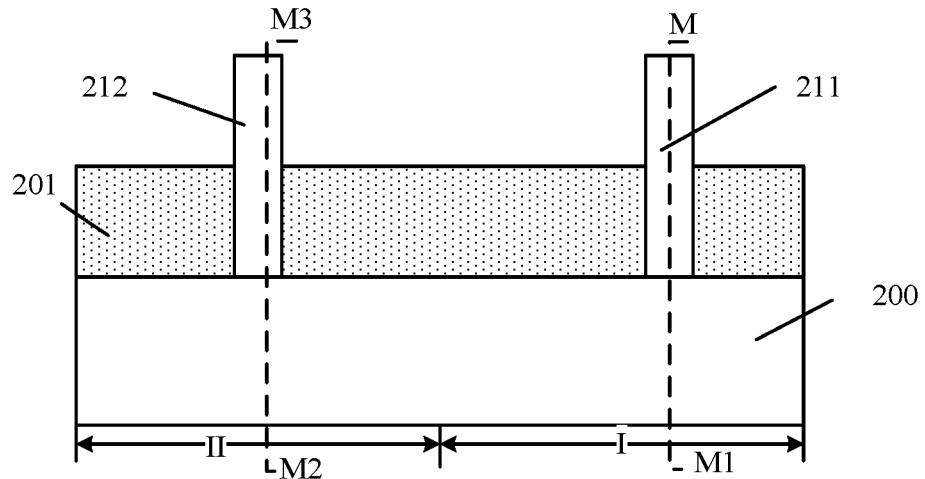
FIGS. 3-11 illustrate schematic views of semiconductor structures at certain stages of an exemplary method for fabricating a semiconductor device consistent with some embodiments of the present disclosure.
Figure 4:
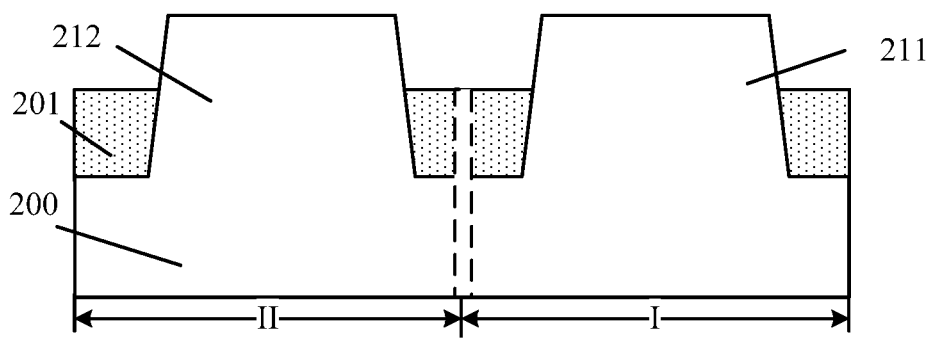

Referring to FIG. 12, a substrate including a first region and a second region may be provided, a first fin structure and a second fin structure may be formed on the substrate in the first region and the second region, respectively, and an isolation layer may be formed on the substrate to partially cover the sidewall surfaces of the first fin structure and the second fin structure, the first fin structure including a first sidewall surface facing to the second fin structure and a second sidewall surface opposite to the first sidewall surface, and the second fin structure including a third sidewall surface facing to the first fin structure and a fourth sidewall surface opposite to the third sidewall surface (S401). FIGS. 3-4 illustrate schematic views of a semiconductor structure consistent with various embodiments of the present disclosure. FIG. 4 illustrates a cross-sectional view of the first region of the semiconductor structure shown in FIG. 3 along an M-M1 direction and a cross-sectional view of the second region of the semiconductor structure shown in FIG. 3 along an M2-M3 direction.

Referring to FIGS. 3-4, a substrate 200 may be provided. The substrate 200 may include a first region I and a second region II. Therefore, FIG. 4 shows both a cross-sectional view of the first region I of the semiconductor structure along the M-M1 direction as illustrated in FIG. 3 and a cross-sectional view of the second region II of the semiconductor structure along the M2-M3 direction as illustrated in FIG. 3.

A first fin structure 211 may be formed on the substrate 200 in the first region I, and a second fin structure 212 may be formed on the substrate 200 in the second region II. The first fin structure 211 may include a first sidewall surface and a second sidewall surface opposite to the first sidewall surface. The first sidewall surface of the first fin structure 211 may face to the second fin structure 212. The second fin structure 212 may include a third sidewall surface and a fourth sidewall surface opposite to the third sidewall surface. The third sidewall surface of the second fin structure 212 may face to the first fin structure 211. In one embodiment, an isolation layer 201 may be disposed on the substrate 200. The isolation layer 201 may cover a portion of the sidewall surfaces of the first fin structure 211 and the second fin structure 212. That is, the isolation layer 201 may cover a portion of each of the first sidewall surface, the second sidewall surface, the third sidewall surface, and the fourth sidewall surface. The top surface of the isolation layer 201 may be lower than the top surfaces of the first fin structure 211 and the second fin structure 212.

The type of the semiconductor device formed in the first region I may be the same as or may be different from the type of the semiconductor device formed in the second region II.

When the types of the semiconductor devices formed in the first region I and the second region II are different, the first region I may be used for forming a P-type device while the second region II may be used for forming an N-type device. Alternatively, the first region I may be used for forming an N-type device while the second region II may be used for forming a P-type device.

In one embodiment, the semiconductor devices formed in the first region I and the second region II may have a same type. For example, the semiconductor devices formed in the first region I and the second region II may be N-type Fin-FETs.

The substrate 200 may be formed by a material including silicon, germanium, SiGe, GaAs, InAs, and any other appropriate semiconductor material. When the substrate 200 is made of silicon, the silicon material may be signal-crystalline silicon, polycrystalline silicon, or amorphous silicon. Alternatively, the substrate 200 may have a semiconductor on insulator structure. The semiconductor on insulator structure may include an insulator and a semiconductor-material layer disposed on the insulator, and the semiconductor-material layer may include silicon, germanium, SiGe, GaAs, InAs, and any other appropriate semiconductor material. In one embodiment, the substrate 200 may be made of single-crystalline silicon.

In one embodiment, the first fin structure 211 and the second fin structure 212 may be formed by patterning the substrate 200. In other embodiments, the formation of the first fin structure and the second fin structure may include the following exemplary steps. First, a fin-structure material layer may be formed on the substrate, and then the fin-structure material layer may be patterned to form the first fin structure and the second fin structure.

In one embodiment, the first fin structure 211 and the second fin structure 212 may both be made of single-crystalline silicon. In other embodiments, the first fin structure and the second fin structure may be made of polycrystalline silicon, amorphous silicon, or any other appropriate semiconductor material.

In one embodiment, the process of forming the isolation layer 201 may include the following exemplary steps. An initial isolation film (not shown) may be formed on the substrate 200, the initial isolation film may cover the top surfaces of the first fin structure 211 and the second fin structure 212. The initial isolation film may be planarized until the top surfaces of the first fin structure 211 and the second fin structure 212 are exposed. The initial isolation film may then be etched back until a portion of the sidewall surfaces of the first fin structure 211 and the second fin structure 212 is exposed. As such, the isolation layer 201 may be formed. The isolation layer 201 may be used to electrically isolate the first fin structure 211 from the second fin structure 212.

The initial isolation film may be made of silicon oxide or silicon nitride. In one embodiment, the isolation layer 201 formed from the initial isolation film may be made of silicon oxide.

Figure 5:
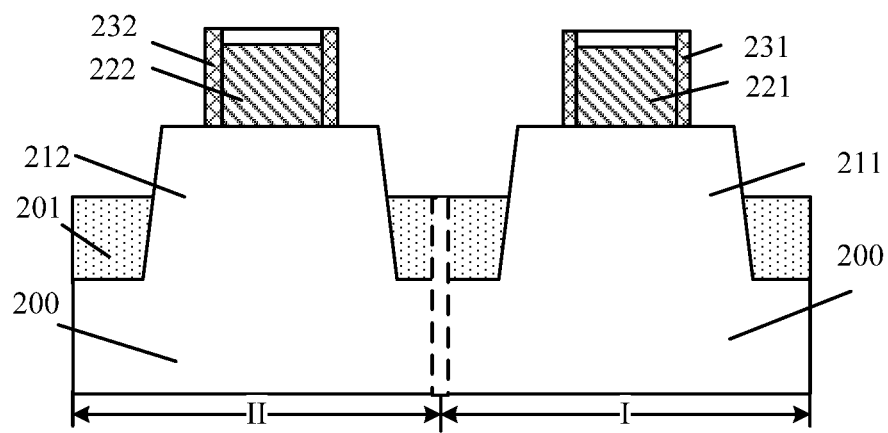

Further, returning to FIG. 12, a first gate structure may be formed on the substrate in the first region across the first fin structure to cover a portion of the top and sidewall surfaces of the first fin structure, and a second gate structure may be formed on the substrate in the second region across the second fin structure to cover a portion of the top and sidewall surfaces of the second fin structure (S402). FIG. 5 illustrates a schematic cross-sectional view of a semiconductor structure consistent with various embodiments of the present disclosure. The cross-sectional view shown in FIG. 5 is along a same direction as the cross-sectional view shown in FIG. 4.

Referring to FIG. 5, a first gate structure 221 may be formed on the substrate 200 in the first region I. The first gate structure 221 may be formed across the first fin structure 211, and may cover a portion of the top and sidewall surfaces of the first fin structure 211. Similarly, a second gate structure 222 may be formed on the substrate 200 in the second region II. The second gate structure 222 may be formed across the second fin structure 212 and may cover a portion of the top and sidewall surfaces of the second fin structure 212.

In one embodiment, the first gate structure 221 may include a first gate dielectric layer (not shown) formed across the first fin structure 211, a first gate electrode layer (not shown) formed on the first gate dielectric layer, and a first gate protective layer (not shown) formed on the first gate electrode layer. Similarly, the second gate structure 222 may include a second gate dielectric layer (not shown) formed across the second fin structure 212, a second gate electrode layer (not shown) formed on the second gate dielectric layer, and a second gate protective layer (not shown) formed on the second gate electrode layer. In other embodiments, the first gate structure may not include the first gate protective layer and/or the second gate structure may not include the second gate protective layer.

In one embodiment, the first gate dielectric layer and the second dielectric layer may be made of silicon oxide, and the first gate electrode layer and the second gate electrode layer may be made of polycrystalline silicon. The first gate protective layer and the second gate protective layer may be made of silicon nitride, SiON, SiCO, SiCN, or SiCON.

In one embodiment, the first gate structure 221 and the second gate structure 222 may be used as dummy gate structures, and in a subsequent process, a high-k metal gate (HKMG) may be formed to replace each of the two dummy gate structures. In other embodiments, the first gate structure and the second gate structure may serve as gate structures of the devices to be formed.

Further, returning to FIG. 12, a first sidewall spacer may be formed on each sidewall surface of the first gate structure and a second sidewall spacer may be formed on each sidewall surface of the second gate structure (S403). The first sidewall spacer and the second sidewall spacer are schematically shown in in FIG. 5.

Referring to FIG. 5, after forming the first gate structure 221 and the second gate structure 222, a first sidewall spacer 231 may be formed on each sidewall surface of the first gate structure 221, and a second sidewall spacer 232 may be formed on each sidewall surface of the second gate structure 222.

In one embodiment, the first sidewall spacer 231 may be able to provide protection for the sidewall surface of the first gate electrode layer, and the second sidewall spacer 232 may be able to provide protection for the sidewall surface of the second gate electrode layer.

The process of forming the first sidewall spacer 231 and the second sidewall spacer 232 may include the following exemplary steps. First, a first sidewall spacer material layer may be formed on the isolation layer 201, the first fin structure 211, the first gate structure 221, the second fin structure 212, and the second gate structure 222. The first sidewall spacer material layer may cover a portion of the sidewall and top surfaces of the first fin structure 211, the sidewall and top surfaces of the first gate structure 221, a portion of the sidewall and top surfaces of the second fin structure 212, and the sidewall and top surfaces of the second gate structure 222. The first sidewall spacer material layer may be etched back until the top surfaces of the first fin structure 211, the second fin structure 212, the first gate protective layer, and the second gate protective layer are exposed. As such, the first sidewall spacer 231 covering the sidewall surface of the first gate structure 221 may be formed on the first fin structure 211, and the second sidewall spacer 232 covering the sidewall surface of the second gate structure 222 may be formed on the second fin structure 212.

The process of forming the first sidewall spacer material layer may include one or more of chemical vapor deposition (CVD), physical vapor deposition (PVD), atomic layer deposition (ALD), and any other appropriate deposition technique. The first sidewall spacer material layer may be made of silicon oxide, silicon nitride, SiON, SiCO, SiCN, or SiCON. In one embodiment, the process of forming the first sidewall spacer material layer may be a CVD process, and the first sidewall spacer 231 and the second sidewall spacer 232 may be made of the silicon nitride.

In a subsequent process, a first sidewall may be formed on the first sidewall surface of the first fin structure. In one embodiment, the process of forming the first sidewall may include the following exemplary steps. A protective layer may be formed on the second fin structure. The protective layer may cover the top and the sidewall surfaces of the second fin structure. After forming the protective layer, a sidewall material layer may be formed on the first fin structure and the protective layer. The sidewall material layer may cover the top and the sidewall surfaces of the first fin structure. Further, the type of the portion of the sidewall material layer formed on the second sidewall surface of the first fin structure may be modified, such that the portion of the sidewall material layer formed on the second sidewall surface of the first fin structure may contain doping ions. Therefore, the portion of the sidewall material layer containing doping ions may have an etch rate different from the etch rate of the portion of the sidewall material layer without containing the doping ions. Moreover, an etch back process may be performed on the sidewall material layer until the top surface of the first fin structure is exposed, such that a first sidewall and a first modified layer opposite to the first sidewall may be formed on the sidewall surfaces of the first fin structure. The first modified layer may contain doping ions. After removing the first modified layer, the first sidewall may be formed on the first sidewall surface of the first fin structure.

Further, the fabrication method may also include forming a second sidewall on the fourth sidewall surface of the second fin structure 212. When the type of the device to be formed in the first region I is different from the type of the device to be formed in the second region II, the first sidewall and the second sidewall may not be formed at the same time. For example, in some embodiments, the second sidewall may be formed after forming the first sidewall. In some other embodiments, the second sidewall may be formed prior to forming the first sidewall.

Figure 6:
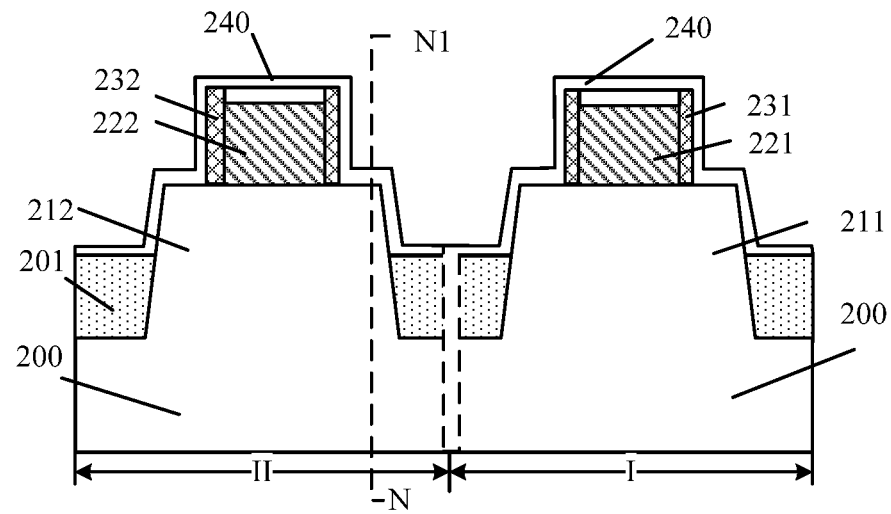
Figure 7:
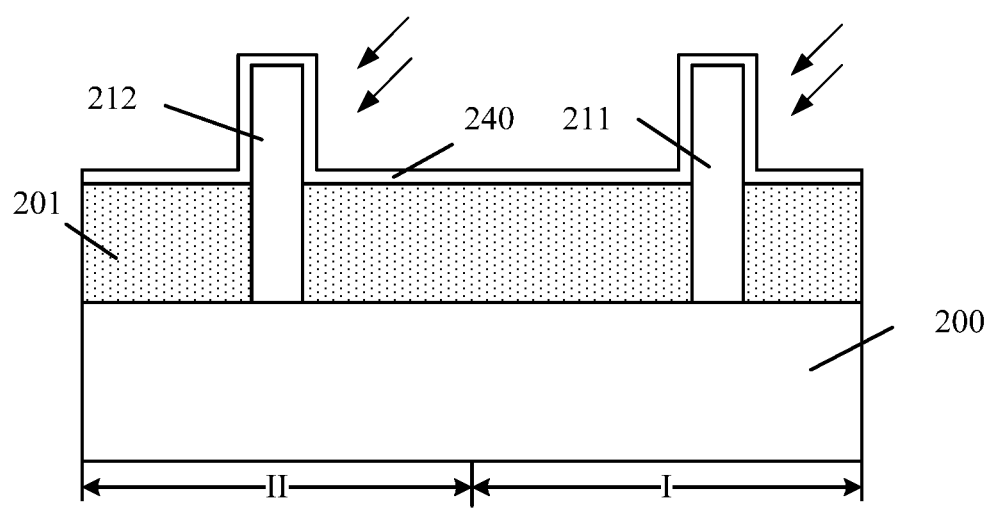

In one embodiment, the second sidewall may be formed during the formation process of the first sidewall. For example, referring to FIG. 12, a sidewall material layer may be formed on the isolation layer, the first fin structure, the first gate structure, the second fin structure, and the second gate structure (S404). FIGS. 6-7 illustrate a schematic cross-sectional view of a semiconductor structure consistent with various embodiments of the present disclosure. Specifically, the cross-sectional view shown in FIG. 6 is along a same direction as the cross-sectional view shown in FIG. 5, and FIG. 7 illustrates the cross-sectional view of the semiconductor structure shown in FIG. 6 along an N-N1 direction.

Referring to FIGS. 6-7, after forming the first sidewall spacer 231 and the second sidewall spacer 232, a sidewall material layer 240 may be formed on the isolation layer 201, the first fin structure 211, the first gate structure 221, the second fin structure 212, and the second gate structure 222.

The sidewall material layer 240 may be used to provide a material layer for forming a first sidewall and a second sidewall in a subsequent process. Moreover, the sidewall material layer 240 may also define a position for forming a source/drain doped layer in a subsequent process.

When the type of the device to be formed in the first region I is different from the type of the device to be formed in the second region II, the source/drain doped layer in the first region I and the source/drain doped layer in the second region II may be made of different materials. Accordingly, when forming the source/drain doped layer in one of the two regions, e.g., the first region I (the second region II), the sidewall material layer 240 may serve as a protective layer for the other one of the two regions, e.g. the second region II (the first region I).

The sidewall material layer 240 may be made of a material including silicon oxide, silicon nitride, SiON, SiCO, SiCN, or SiCON. The process of forming the sidewall material layer 240 may be a deposition process, such as an ALD process, a plasma chemical vapor deposition (PCVD) process, etc.

In one embodiment, the sidewall material layer 240 may be made of silicon nitride, and the thickness of the sidewall material layer 240 may be in a range of approximately 10 Å to 30 Å. The thickness of the sidewall material layer 240 may define the thickness of the first sidewall and the gate sidewall formed in a subsequent process. When the thickness of the sidewall material layer 240 is larger than 30 Å, the thickness of the subsequently-formed gate sidewall may be large. Therefore, the source/drain doped layer may be far away from the trench region, and thus the stress that the source/drain doped layer applies to the channel may be reduced. When the thickness of the sidewall material layer 240 is smaller than 10 Å, the thickness of the subsequently-formed gate sidewall may be small. Therefore, the source/drain doped layer may be close to the trench region, and thus the short channel effect may be significant.

In one embodiment, the sidewall material layer 240 may be formed through an ALD process. The process parameters used in the ALD process may include a mixed gas of $SiH_2Cl_2$ and $NH_3$, a flow rate of the mixed gas in a range of approximately 1500 sccm to 4000 sccm, a process pressure in a range of approximately 1 mTorr to 10 mTorr, a process temperature in a range of approximately 200° C. to 600° C., and a deposition time in a range of approximately 30 times to 300 times.

After forming the sidewall material layer 240, the type of the portion of the sidewall material layer 240 formed on the second sidewall surface of the first fin structure 211 and on the third sidewall surface of the second sidewall fin structure 212 may be modified, such that the portion of the sidewall material layer 240 formed on the second sidewall surface of the first fin structure 211 and on the third sidewall surface of the second fin structure 212 may contain doping ions. As such, the etch rate of the portion of the sidewall material layer 240 containing the doping ions may be different from the etch rate of the portion of the sidewall material layer 240 without containing the doping ions.

In one embodiment, modifying the semiconductor type may be implemented by an ion doping process. The doping ions used in the ion doping process may include argon ions or silicon ions. When the doping ions enter the atomic structure of silicon nitride, the atomic structure of the silicon nitride may be destroyed, and the doped silicon nitride may be easily removed. The ion doping process may be an ion implantation process.

In one embodiment, an ion implantation process may be adopted. When the doping ions are argon ions or silicon ions, the process parameters of the ion implantation process may include an implantation dose in a range of approximately 1.0E14 $atom/cm^2$ to 1.0E17 $atom/cm^2$.

Further, referring to FIG. 12, the sidewall material layer may be etched back until the top surfaces of the first fin structure, the second fin structure, and the isolation layer are exposed, such that a first sidewall may be formed on the first sidewall surface of the first fin structure, a first modified layer may be formed on the second sidewall surface of the first fin structure, a second sidewall may be formed on the fourth sidewall surface of the second fin structure, and a second modified layer may be formed on the third sidewall surface of the second fin structure (S405). The cross-sectional view shown in FIG. 8 is along a same direction as the cross-sectional view shown in FIG. 7.

Figure 8:
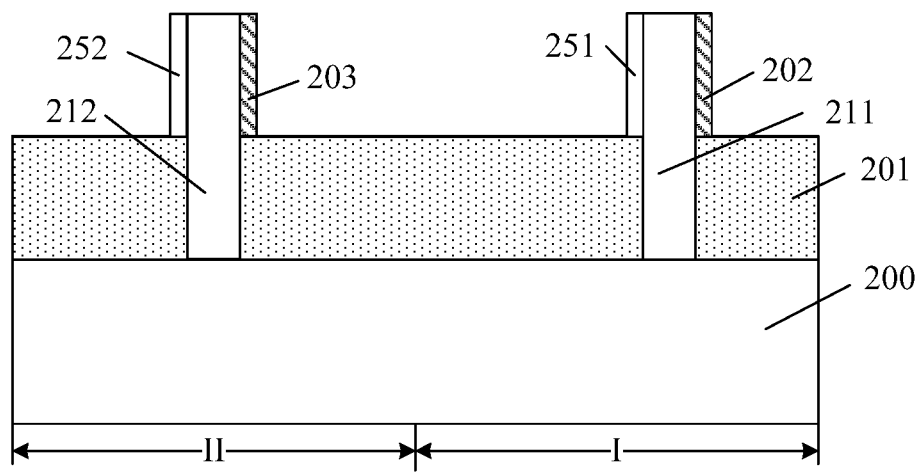

Referring to FIGS. 7-8, the sidewall material layer 240 may be etched back until the top surfaces of the first fin structure 211, the second fin structure 212, and the isolation layer. As such, a first sidewall 251 may be formed on the first sidewall surface of the first fin structure 211, a first modified layer 202 may be formed on the second sidewall surface of the first fin structure 211, a second sidewall 252 may be formed on the fourth sidewall surface of the second fin structure 212, and a second modified layer 203 may be formed on the third sidewall surface of the second fin structure 212.

In one embodiment, the first modified layer 202 and the second modified layer 203 may both contain doping ions.

The sidewall material layer 240 may be made of silicon nitride, and the doping ions may include argon ions or silicon ions. In one embodiment, the sidewall material layer 240 may be made of silicon nitride, and the doping ions may be silicon ions. When silicon ions enter the atomic structure of silicon nitride, the atomic structure of silicon nitride may be destroyed, and thus silicon nitride may be removed easily. Further, when a proper etching solution is used in a subsequent process to remove the first modified layer 202 and the second modified layer 203, damages to the first sidewall 251 and the second sidewall 252 may be reduced.

In one embodiment, the process of forming the first sidewall 251 and the second sidewall 252 may include the following exemplary steps. First, a first initial sidewall may be formed on the sidewall surfaces of the first fin structure, and a second initial sidewall may be formed on the sidewall surfaces of the second fin structures. The type of the portion of the first initial sidewall formed on the second sidewall surface of the first fin structure and the portion of the second initial sidewall formed on the third sidewall surface of the second fin structure may be modified, such that a first modified layer 202 and a second modified layer 203 may be formed on the second sidewall surface of the first fin structure and the third sidewall surface of the second fin structure, respectively. The first modified layer 202 and the second modified layer 203 may contain doping ions, and thus the etch rate of the first modified layer 202 and the second modified layer 203 may be different from the etch rate of the first initial sidewall and the second initial sidewall. Further, the first modified layer 202 and the second modified layer 203 may be removed to form a first sidewall 251 on the first sidewall surface of the first fin structure 211 and a second sidewall 252 on the fourth sidewall surface of the second fin structure 212.

The process of forming the first initial sidewall and the second initial sidewall may include the following exemplary steps. First, a sidewall material layer (not shown) may be formed on the substrate 200. The sidewall material layer may cover the top and the sidewall surfaces of the first fin structure 211 and the top and the sidewall surfaces of the second fin structure 212. The sidewall material layer may be etched back to form the first initial sidewall on the sidewall surfaces of the first fin structure and the second initial sidewall on the sidewall surfaces of the second fin structure.

After forming the first sidewall 251 and the second sidewall 252, in a subsequent process, a first doped layer may be formed in the first fin structure 211, and a portion of the sidewall surfaces of the first doped layer may be covered by the first sidewall 251. In one embodiment, the fabrication method may further include forming a second doped layer in the second fin structure 212, and a portion of the sidewall surfaces of the second doped layer may be covered by the second sidewall 252.

When the type of the device to be formed in the first region I is different from the type of the device to be formed in the second region II, the device formed from the first gate structure 221 may have a type different from the type of the device formed from the second gate structure 222. Therefore, the first doped layer and the second doped layer may not be formed at the same time. For example, in some embodiments, the second doped layer may be formed after forming the first doped layer, and in other embodiments, after forming the second doped layer, the first doped layer may be formed.

When the type of the device to be formed in the first region I is the same as the type of the device to be formed in the second region II, the device formed from the first gate structure 221 and the device formed from the second gate structure 222 may have a same type. Therefore, the first doped layer and the second doped layer may be formed at the same time.

The process of forming the first doped layer may include forming a first trench in the first fin structure 211 on both sides of the first gate structure 221, and then epitaxially forming a first doped layer in the first trench.

Similarly, the process of forming the second doped layer may include forming a second trench in the second fin structure 212 on both sides of the second gate structure 222, and then epitaxially forming a second doped layer in the second trench.

In one embodiment, the type of the device to be formed in the first region I may be the same as the type of the device to be formed in the second region II, and the second doped layer may be simultaneously formed when forming the first doped layer.

Figure 9:
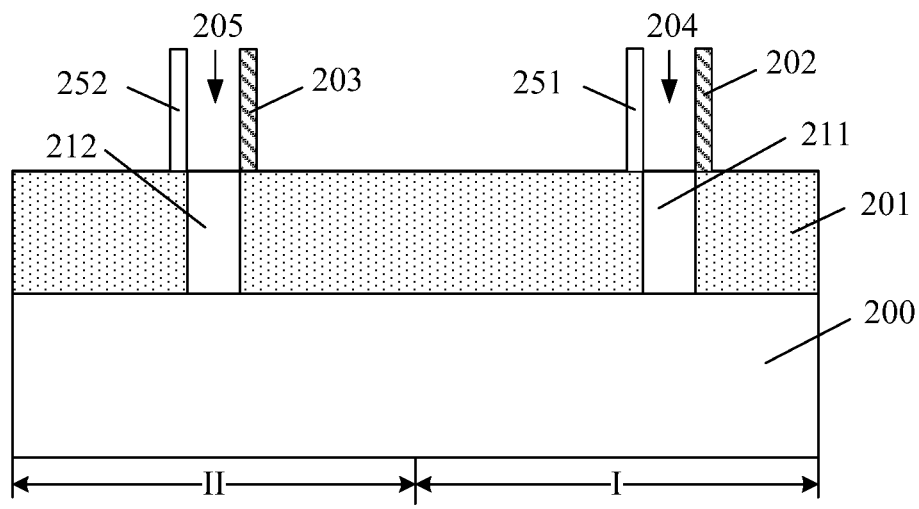

For example, referring to FIG. 12, a first initial trench may be formed by removing the portion of the first fin structure located between the first sidewall and the first modified layer, and a second initial trench may be formed by removing the portion of the second fin structure located between the second sidewall and the second modified layer (S406). FIG. 9 illustrates a schematic cross-sectional view of a semiconductor structure consistent with various embodiments of the present disclosure.

Referring to FIG. 9, a first initial trench 204 may be formed by removing the portion of the first fin structure 211 located between the first sidewall 251 and the first modified layer 202. In addition, a second initial trench 205 may be formed by removing the portion of the second fin structure 212 located between the second sidewall 252 and the second modified layer 203.

In one embodiment, the first initial trench 204 may be formed in the first fin structure 211 on the two sides of the first gate structure 221, and the second initial trench 205 may be formed in the second fin structure 212 on the two sides of the second gate structure 222. The first initial trench 204 may provide a space for subsequent formation of a first trench, and the second initial trench 205 may provide a space for subsequent formation of a second trench.

The bottom surfaces of the first initial trench 204 and the second initial trench 205 may be leveled with or lower than the top surface of the isolation layer 201. In one embodiment, the bottom surfaces of the first initial trench 204 and the second initial trench 205 may be leveled with the top surface of the isolation layer 201.

Further, returning to FIG. 12, after forming the first initial trench and the second initial trench, the first modified layer and the second modified layer may be removed, such that a first trench may be formed from the first initial trench, and a second trench may be formed from the second initial trench (S407). FIG. 10 illustrates a schematic cross-sectional view of a semiconductor structure consistent with various embodiments of the present disclosure.

Referring to FIG. 10, after forming the first initial trench 204 and the second initial trench 205, the first modified layer 202 and the second modified layer 203 may be removed. The first sidewall 251 may remain on the first sidewall surface of the first fin structure 211, and the second sidewall 252 may remain on the fourth sidewall surface of the second fin structure 212.

In one embodiment, after removing the first modified layer 202 and the second modified layer 203, the initial first trench 204 may become a first trench 206 and the initial second trench 205 may become a second trench 207.

The process of removing the first modified layer 202 and the second modified layer 203 may include a dry etching process or a wet etching process. When a wet etching process is performed to remove the first modified layer 202 and the second modified layer 203, the process parameters may include a volume concentration percentage of phosphoric acid in a range of approximately 70% to 95%, and a process temperature in a range of approximately 90° C. to 150° C.

In one embodiment, the first modified layer 202 and the second modified layer 203 may be formed by introducing doping ions into the sidewall material layer 240 (referring to FIG. 7). Therefore, the material of the first modified layer 202 and the second modified layer 203 may be silicon nitride doped with doping ions. When the doping ions are silicon ions, the doping ions may be able to destroy the atomic structure of silicon nitride, such that after the completion of the doping process, silicon nitride may be easily removed. Therefore, when removing the first modified layer 202 and the second modified layer 203, the first sidewall 251 and the second sidewall 252 may not be significantly affected.

The first sidewall 251 may be located on one side of the first trench 206, and the second sidewall 252 may also be located on the same side of the second trench 207. That is, the first sidewall 251 and the second sidewall 252 may have a same position relationship with respect to the first trench 206 and the second trench 207, respectively.

In a subsequent process, a first doped layer may be formed in the first trench 206 and a second doped layer may be formed in the second trench 207. Because the first doped layer is restricted by the first sidewall 251, the surface of the first doped layer may unlikely form sharp tips on the side adjacent to the first sidewall 251. Similarly, because the second doped layer is restricted by the second sidewall 252, the surface of the second doped layer may unlikely form sharp tips on the side adjacent to the second sidewall 252.

For example, returning to FIG. 12, after forming the first sidewall and the second sidewall, a first doped layer may be formed in the first fin structure by filling the first trench, and a second doped layer, adjacent to the first doped layer, may be formed in the second fin structure by filling the second trench (S408). FIG. 11 illustrates a schematic cross-sectional view of a semiconductor structure consistent with various embodiments of the present disclosure.

Referring to FIG. 11, after forming the first sidewall 251 and the second sidewall 252, a first doped layer 261 may be formed in the first fin structure 211 and a second doped layer 262 may be formed in the second fin structure 212. The first doped layer 261 and the second doped layer 262 may be adjacent to each other.

In one embodiment, the first doped layer 261 may be formed epitaxially in the first trench 206 (referring to FIG. 10). That is, the first trench 206 may be epitaxially filled with the first doped layer 261. During the process of epitaxially forming the first doped layer 261, an in-situ doping process may be performed on the first doped layer 261, such that the first doped layer 261 may be doped with first doping ions.

When the first gate structure 221 is used to form a P-type device, the first doped layer 261 may be made of SiGe doped with the first doping ions, and the first doping ions may be P-type conduction ions. When the first gate structure 221 is used to form an N-type device, the first doped layer 261 may be made of silicon doped with the first doping ions, and the first doping ions may be N-type conduction ions.

Similarly, the second doped layer 262 may be formed epitaxially in the second trench 207 (referring to FIG. 10). That is, the second trench 207 may be epitaxially filled with the second doped layer 262. During the process of epitaxially forming the second doped layer 262, an in-situ doping process may be performed on the second doped layer 262, such that the second doped layer 262 may be doped with second doping ions.

When the second gate structure 222 is used to form a P-type device, the second doped layer 262 may be made of SiGe doped with the second doping ions, and the second doping ions may be P-type conduction ions. When the second gate structure 222 is used to form an N-type device, the second doped layer 262 may be made of silicon doped with the second doping ions, and the second doping ions may be N-type conduction ions.

In one embodiment, the type of the device to be formed in the first region I may be the same as the type of the device to be formed in the second region II. For example, the first gate structure 221 and the second gate structure 222 may be both used to form P-type devices, the first doped layer 261 and the second doped layer 262 may be both made of SiGe doped with boron ions. That is, the first doping ions and the second doping ions may all be boron ions.

In some other embodiments, the first gate structure 221 and the second gate structure 222 may be both used to form N-type devices, the first doped layer 261 and the second doped layer 262 may be both made of silicon doped with phosphor ions. That is, the first doping ions and the second doping ions may all be phosphor ions.

In other embodiments, the type of the device to be formed in the first region I may be different from the type of the device to be formed in the second region II. For example, the first gate structure 221 may be used to form a P-type device, while the second gate structure 222 may be used to form an N-type device. Alternatively, the first gate structure 221 may be used to form an N-type device, while the second gate structure 222 may be used to form a P-type device.

According to the disclosed semiconductor device and fabrication method, the first sidewall 251 is formed on the first sidewall surface of the first fin structure 211 with the first sidewall surface facing to the second fin structure 212. The first doped layer 261 is formed in the first fin structure 211, and the second doped layer 262 is formed in the second fin structure 212. Therefore, the first sidewall 251 is located between the first doped layer 261 and the second doped layer 262, and thus may physically isolate the first doped layer 261 from the second doped layer 262, preventing the first doped layer 261 from bridging with the second doped layer 262. In the meantime, the second sidewall 252 is formed on the fourth sidewall surface of the second fin structure 212, and the second doped layer 261 is formed in the second fin structure 212. As such, bridging between the second doped layer 262 and the doped layer formed in the adjacent fin structure to which the fourth sidewall surface of the second fin structure 212 faces may be prevented. When the distance between adjacent fin structures has a certain value, the first doped layer 261 and the adjacent second doped layer 262 may both have a large volume without bridging with each other. Therefore, the surface areas of the first doped layer 261 and the second doped layer 262 may also be large. In a subsequent process, various plugs may be formed to electrically connect the first doped layer 261 and the second doped layer 262, and the contacts formed between the plugs and the first doped layer 261 or between the plugs and the second doped layer 262 are full-coverage type contacts. That is, the corresponding plug completely covers the surface of the first doped layer 261 or the second doped layer 262. When the surface area of the first doped layer 261 or the second doped layer 262 is large, the contact area between the first doped layer 261 and the corresponding plug or between the second doped layer 262 and the corresponding plug is also large, such that the contact resistance in the formed transistor may be reduced. Therefore, the performance of the device may be improved.

In some embodiments, the second sidewall may not be formed. A first sidewall is formed on the first sidewall surface of the first fin structure, and the first sidewall surface of the first fin structure faces to the second fin structure. That is, the first sidewall is located between the first fin structure and the second fin structure. Moreover, the first doped layer is formed in the first fin structure, and the second doped layer is formed in the second fin structure. Therefore, the first sidewall is located between the first doped layer and the second doped layer, and thus may physically isolate the first doped layer from the second doped layer, preventing the first doped layer from bridging with the second doped layer.

Accordingly, the present disclosure also provides a semiconductor device formed through the method described above. FIG. 11 illustrates a schematic cross-sectional view of an exemplary semiconductor device consistent with various embodiments of the present disclosure. Referring to FIG. 11, the semiconductor device may include a substrate 200, and a first fin structure 211 and a second fin structure 212 formed on the substrate 200. The first fin structure 211 and the second fin structure 212 may be adjacent to each other. The first fin structure 211 may include a first sidewall surface and a second sidewall surface opposite to the first sidewall surface. The first sidewall surface of the first fin structure 211 may face to the second fin structure 212. The semiconductor device may further include an isolation layer 201 formed on the substrate 200. The isolation layer 201 may cover a portion of the sidewall surfaces of the first fin structure 211 and the second fin structure 212. The top surface of the isolation layer 201 may be lower than the top surfaces of the first fin structure 211 and the second fin structure 212. The semiconductor device may include a first sidewall 251 formed on the first sidewall surface of the first fin structure 211, a first doped layer 261 formed in the first fin structure 211, and a second doped layer 262 formed in the second fin structure 212. The first sidewall 251 may cover a portion of the sidewall surface of the first doped layer 261. Therefore, the first sidewall 251 may be located between the first doped layer 261 and the second doped layer 262, and thus may physically isolate the first doped layer 261 from the second doped layer 262, preventing the first doped layer 261 from bridging with the second doped layer 262.

For detailed description of the substrate 200, reference may be made to the corresponding description provided in the embodiments above. Similarly, for detailed description of the structure and the position of the first sidewall 251, reference may be made to the corresponding description provided in the embodiments above; and for detailed description of the materials and the positions of the first doped layer 261 and the second doped layer 262, reference may be made to the corresponding description provided in the embodiments above.

In some embodiments, the second fin structure 212 may include a third sidewall surface and a fourth sidewall surface opposite to the third sidewall surface. The third sidewall surface of the second fin structure 212 may face to the first fin structure 211. The semiconductor device may include a second sidewall formed on the fourth sidewall surface of the second fin structure 212. As such, bridging between the second doped layer 262 and a doped layer formed in the adjacent fin structure to which the fourth sidewall surface of the second fin structure 212 faces may be prevented. Therefore, the performance of the device may be improved.

Compared to existing semiconductor devices and fabrication methods, the disclosed semiconductor device and fabrication method may demonstrate the following exemplary advantages.

According to the disclosed semiconductor device and fabrication method, a first sidewall is formed on the first sidewall surface of the first fin structure, and the first sidewall surface of the first fin structure faces to the second fin structure. That is, the first sidewall is located between the first fin structure and the second fin structure. Moreover, the first doped layer is formed in the first fin structure, and the second doped layer is formed in the second fin structure. Therefore, the first sidewall is located between the first doped layer and the second doped layer, and thus may physically isolate the first doped layer from the second doped layer, preventing the first doped layer from bridging with the second doped layer.

When the distance between adjacent fin structures has a certain value, the first doped layer and the adjacent second doped layer both have a large volume without bridging with each other. Therefore, the surface areas of the first doped layer and the second doped layer are also large. In a subsequent process, various plugs are formed to electrically connect the first doped layer and the second doped layer, and the contacts formed between the plugs and the first doped layer or between the plugs and the second doped layer are full-coverage type contacts. That is, the corresponding plug completely covers the surface of the first doped layer or the second doped layer. When the surface area of the first doped layer or the second doped layer is large, the contact area between the first doped layer and the corresponding plug or between the second doped layer and the corresponding plug is also large, such that the contact resistance in the formed transistor may be reduced. Therefore, the performance of the device may be improved.

Further, the second fin structure has a third sidewall surface facing to the first fin structure and a fourth sidewall surface opposite to the third sidewall surface. A second sidewall is formed on the fourth sidewall surface of the second fin structure. As such, bridging between the second doped layer and a doped layer formed in the adjacent fin structure to which the fourth sidewall surface of the second fin structure faces may be prevented. Therefore, the performance of the device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:

forming a first fin structure and a second fin structure adjacent to the first fin structure on a substrate, wherein the first fin structure includes a first sidewall surface and a second sidewall surface opposite to the first sidewall surface, and the first sidewall surface faces to the second fin structure;

forming an isolation layer on the substrate, wherein the isolation layer covers a portion of sidewall surfaces of the first fin structure and the second fin structure, and a top surface of the isolation layer is lower than top surfaces of the first fin structure and the second fin structure;

forming a first sidewall on the first sidewall surface of the first fin structure and a first modified layer on the second sidewall surface of the first fin structure;

forming a first trench in the first fin structure;

removing the first modified layer and epitaxially forming the first doped layer in the first trench;

after forming the first sidewall, forming a first doped layer in the first fin structure, wherein the first sidewall covers a portion of a sidewall surface of the first doped layer; and forming a second doped layer in the second fin structure.

2. The method according to claim 1, wherein:

the second fin structure includes a third sidewall surface and a fourth sidewall surface opposite to the third sidewall surface, and the third sidewall surface faces to the first fin structure;

the method further includes forming a second sidewall on the fourth sidewall surface of the second fin structure prior to forming the second doped layer in the second fin structure, wherein the second sidewall covers a portion of a sidewall surface of the second doped layer.

3. The method according to claim 2, wherein:

the second sidewall is formed after forming the first sidewall; or the second sidewall is formed prior to forming the first sidewall.

4. The method according to claim 2, wherein:

the first sidewall and the second sidewall are formed simultaneously.

5. A method for fabricating a semiconductor device, comprising:

forming a first fin structure and a second fin structure adjacent to the first fin structure on a substrate, wherein the first fin structure includes a first sidewall surface and a second sidewall surface opposite to the first sidewall surface, and the first sidewall surface faces to the second fin structure;

forming an isolation layer on the substrate, wherein the isolation layer covers a portion of sidewall surfaces of the first fin structure and the second fin structure, and a top surface of the isolation layer is lower than top surfaces of the first fin structure and the second fin structure;

forming a first sidewall on the first sidewall surface of the first fin structure;

after forming the first sidewall, forming a first doped layer in the first fin structure, wherein the first sidewall covers a portion of a sidewall surface of the first doped layer; and forming a second doped layer in the second fin structure, wherein:

the second fin structure includes a third sidewall surface and a fourth sidewall surface opposite to the third sidewall surface, and the third sidewall surface faces to the first fin structure;

the method further includes forming a second sidewall on the fourth sidewall surface of the second fin structure prior to forming the second doped layer in the second fin structure, wherein the second sidewall covers a portion of a sidewall surface of the second doped layer, the first sidewall and the second sidewall are formed simultaneously, and simultaneously forming the first sidewall and the second sidewall includes:

forming a sidewall material layer on the substrate, wherein the sidewall material layer covers top and sidewall surfaces of the first fin structure and also covers top and sidewall surfaces of the second fin structure;

modifying a type of a portion of the sidewall material layer formed on the second sidewall surface of the first fin structure and a portion of the sidewall material layer formed on the third sidewall surface of the second fin structure, such that the portion of the sidewall material layer formed on the second sidewall surface of the first fin structure and the portion of the sidewall material layer formed on the third sidewall surface of the second fin structure contain doped ions and have an etch rate different from an etch rate of an undoped portion of the sidewall material layer, wherein modifying the type of the portion of the sidewall material layer formed on the sidewall surface of the first fin structure and the portion of the sidewall material layer formed on the third sidewall surface of the second fin structure includes an ion doping process;

forming the first sidewall on the first sidewall surface of the first fin structure, a first modified layer on the second sidewall surface of the first fin structure, the second sidewall on the fourth surface of the second fin structure, and a second modified layer on the third sidewall surface of the second fin structure by etching back the sidewall material layer until top surfaces of the first fin structure and the second fin structure are exposed, wherein the first modified layer and the second modified layer contain doping ions; and removing the first modified layer and the second modified layer to form the first sidewall on the first sidewall surface of the first fin structure and the second sidewall on the fourth sidewall surface of the second fin structure.

6. The method according to claim 5, wherein:

the ion doping process is an ion implantation process, wherein:

doping ions used in the ion implantation process include argon ions or silicon ions, and an implantation dose is a range of approximately 1.0E14 atom/cm$^2$ to 1.0E17 atom/cm$^2$; and removing the first modified layer and the second modified layer includes a dry etching process or a wet etching process.

7. The method according to claim 6, wherein:
the first modified layer and the second modified layer are removed the wet etching process, wherein:
process parameters adopted in the wet etching process include a volume concentration percentage of phosphoric acid in a range of approximately 70% to 95%, and a process temperature in a range of approximately 90° C. to 150° C.

8. The method according to claim 5, wherein:
forming the first doped layer includes forming a first trench in the first fin structure, and epitaxially forming the first doped layer in the first trench, wherein:
forming the first trench includes prior to removing the first modified layer, removing a portion of the first fin structure located between the first sidewall and the first modified layer to form a first initial trench, and removing the first modified layer formed on a sidewall surface of the first initial trench to form the first trench.

9. The method according to claim 5, wherein:
forming the second doped layer includes forming a second trench in the second fin structure, and epitaxially forming the second doped layer in the second trench, wherein:
forming the second trench includes prior to removing the second modified layer, removing a portion of the second fin structure located between the second sidewall and the second modified layer to form a second initial trench, and removing the second modified layer formed on a sidewall surface of the second initial trench to form the second trench.

10. The method according to claim 4, wherein simultaneously forming the first sidewall and the second sidewall includes:
forming a first initial sidewall on sidewall surfaces of the first fin structure and a second initial sidewall on sidewall surfaces of the second fin structure;
modifying a type of a portion of the first initial sidewall formed on the second sidewall surface of the first fin structure and a portion of the second initial sidewall formed on the third sidewall surface of the second fin structure to form a first modified layer on the second sidewall surface of the first fin structure and a second modified layer on the third sidewall surface of the second fin structure, wherein modifying the type of the portion of the first initial sidewall formed on the second sidewall surface of the first fin structure and the portion of the second initial sidewall formed on the third sidewall surface of the second fin structure includes an ion doping process, the first modified layer and the second modified layer contain doping ions, and the first modified layer and the second modified layer have an etch rate different from an etch rate of the first initial sidewall and the second initial sidewall; and
removing the first modified layer and the second modified layer to form the first sidewall on the first sidewall surface of the first fin structure and the second sidewall on the fourth sidewall surface of the second fin structure.

11. The method according to claim 10, wherein forming the first initial sidewall on the sidewall surfaces of the first fin structure and the second initial sidewall on the sidewall surfaces of the second fin structure includes:
forming a sidewall material layer on the substrate, wherein the sidewall material layer covers top and sidewall surfaces of the first fin structure and also covers top and sidewall surfaces of the second fin structure;
etching back the sidewall material layer to form the first initial sidewall on the sidewall surfaces of the first fin structure and the second initial sidewall on the sidewall surfaces of the second fin structure.

12. The method according to claim 10, wherein:
the ion doping process is an ion implantation process, wherein:
doping ions used in the ion implantation process include argon ions or silicon ions, and an implantation dose is a range of approximately $1.0E14$ atom/$cm^2$ to $1.0E17$ atom/$cm^2$; and
removing the first modified layer and the second modified layer includes a dry etching process or a wet etching process.

13. The method according to claim 12, wherein:
the first modified layer and the second modified layer are removed the wet etching process, wherein:
process parameters adopted in the wet etching process include a volume concentration percentage of phosphoric acid in a range of approximately 70% to 95%, and a process temperature in a range of approximately 90° C. to 150° C.

14. The method according to claim 10, wherein:
forming the first doped layer includes forming a first trench in the first fin structure, and epitaxially forming the first doped layer in the first trench, wherein:
forming the first trench includes prior to removing the first modified layer, removing a portion of the first fin structure located between the first sidewall and the first modified layer to form a first initial trench, and removing the first modified layer formed on a sidewall surface of the first initial trench to form the first trench.

15. The method according to claim 10, wherein:
forming the second doped layer includes forming a second trench in the second fin structure, and epitaxially forming the second doped layer in the second trench, wherein:
forming the second trench includes prior to removing the second modified layer, removing a portion of the second fin structure located between the second sidewall and the second modified layer to form a second initial trench, and removing the second modified layer formed on a sidewall surface of the second initial trench to form the second trench.

16. A method for fabricating a semiconductor device, comprising:
forming a first fin structure and a second fin structure adjacent to the first fin structure on a substrate, wherein the first fin structure includes a first sidewall surface and a second sidewall surface opposite to the first sidewall surface, and the first sidewall surface faces to the second fin structure;
forming an isolation layer on the substrate, wherein the isolation layer covers a portion of sidewall surfaces of the first fin structure and the second fin structure, and a top surface of the isolation layer is lower than top surfaces of the first fin structure and the second fin structure;
forming a first sidewall on the first sidewall surface of the first fin structure;

after forming the first sidewall, forming a first doped layer in the first fin structure, wherein the first sidewall covers a portion of a sidewall surface of the first doped layer; and forming a second doped layer in the second fin structure wherein forming the first sidewall includes:
- forming a protective layer on the second fin structure, wherein the protective layer covers top and sidewall surfaces of the second fin structure;
- after forming the protective layer, forming a sidewall material layer on the first fin structure and the protective layer, wherein the sidewall material layer covers top and sidewall surfaces of the first fin structure;
- modifying a type of a portion of the sidewall material layer formed on the second sidewall surface of the first fin structure, such that the portion of the sidewall material layer formed on the second sidewall surface of the first fin structure contains doping ions, wherein the portion of the sidewall material layer containing doping ions has an etch rate different from an etch rate of an undoped portion of the sidewall material layer, and modifying the type of the portion of the sidewall material layer formed on the second sidewall surface of the first fin structure includes an ion doping process;
- forming the first sidewall on the first sidewall surface of the first fin structure and a first modified layer on the second sidewall surface of the first fin structure by etching back the sidewall material layer until the top surface of the first fin structure is exposed, wherein the first modified layer contains doping ions; and
- removing the first modified layer.

17. The method according to claim 16, wherein:
the ion doping process is an ion implantation process, wherein:
- doping ions used in the ion implantation process include argon ions or silicon ions, and an implantation dose is a range of approximately 1.0E14 atom/cm$^2$ to 1.0E17 atom/cm$^2$.

18. The method according to claim 1, wherein:
the second doped layer is formed after forming the first doped layer or the second doped layer is formed prior to forming the first doped layer.

19. The method according to claim 1, wherein:
the first doped layer and the second doped layer are formed simultaneously.

20. The method according to claim 1, wherein:
the first trench is formed between the first sidewall and the first modified layer, and
epitaxially forming the first doped layer in the first trench is performed after removing the first modified layer.

* * * * *